United States Patent
Murrell et al.

(10) Patent No.: US 6,686,601 B2
(45) Date of Patent: Feb. 3, 2004

(54) ION SOURCES FOR ION IMPLANTATION APPARATUS

(75) Inventors: Adrian Murrell, Horsham (GB); Peter Michael Banks, Horsham (GB); Andrew Allen, Horsham (GB); Neil L. Clarke, Brighton (GB); Matthew Peter Dobson, Brighton (GB)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/307,499

(22) Filed: Dec. 2, 2002

(65) Prior Publication Data

US 2003/0122089 A1 Jul. 3, 2003

(30) Foreign Application Priority Data

Dec. 3, 2001 (GB) ................................ 0128913

(51) Int. Cl.⁷ ................................ H01J 37/08
(52) U.S. Cl. ................. 250/492.21; 250/423 R; 250/424; 250/426; 315/111.81
(58) Field of Search ............. 250/492.21, 492.2, 250/492.3, 423 R, 424, 426, 427; 315/111.81, 111.91, 111.21; 313/362.1; 204/298.05, 298.41

(56) References Cited

U.S. PATENT DOCUMENTS

| | | | |
|---|---|---|---|
| 4,999,309 A | 3/1991 | Buynoski | |
| 5,073,507 A | 12/1991 | Keller et al. | |
| 5,429,070 A | * 7/1995 | Campbell et al. | ....... 118/723 R |
| 5,656,820 A | * 8/1997 | Murakoshi et al. | .... 250/492.21 |
| 5,700,580 A | 12/1997 | Becker et al. | |
| 5,707,424 A | 1/1998 | Tom et al. | |
| 5,977,552 A | 11/1999 | Foad | |
| 6,001,172 A | 12/1999 | Bhandari et al. | |
| 2002/0043630 A1 | 4/2002 | Chakor | |
| 2002/0050573 A1 | * 5/2002 | Suguro et al. | ......... 250/492.21 |

FOREIGN PATENT DOCUMENTS

| | | | |
|---|---|---|---|
| EP | 0637052 | 2/1995 | |
| EP | 0945892 | * 9/1999 | ............ H01J/27/04 |
| FR | 2803090 | 6/2001 | |
| WO | 9959701 | 11/1999 | |

* cited by examiner

Primary Examiner—Bruce Anderson
Assistant Examiner—James P. Hughes
(74) Attorney, Agent, or Firm—Boult Wade Tennant (57) ABSTRACT

The invention relates to an ion source for an ion implanter in which source material for providing desired ions is provided in the form of a plate or liner which can be fitted into the reactant chamber of the ion source.

23 Claims, 5 Drawing Sheets

ION SOURCES FOR ION IMPLANTATION APPARATUS

The present invention is concerned with ion implantation apparatus and particularly with ion sources for such apparatus.

In the manufacture of semiconductor devices and integrated circuits it is necessary to modify the semiconductor substrate material (particularly silicon) by diffusing or implanting therein atoms or molecules of selected dopants to produce regions in the semiconductor substrate of selected varying conductivity and having majority charge carriers of different polarities.

Accuracy and control of the doping of the semiconductor substrate using ion implantation has become increasingly important with the continuing reduction in feature sizes of integrated circuit structures.

Typical dopant materials used in this process are boron, phosphorus, arsenic and antimony, but there is also a requirement for implanting of other ions, including, for example, as well as erbium, magnesium, indium and refractory metal ions, and aluminium ions into such substrates to produce faster switching for bipolar transistors.

As to aluminium ion implantation, this is evidenced by, for example, U.S. Pat. No. 4,999,309 in which implantation and diffusion of aluminium ions into silicon monolithic integrated circuits is described to form high performance PNP transistors and PN junction capacitors.

Various apparatuses have been devised and various methods and processes have been carried out to produce and implant aluminium ions.

One such method of producing aluminium ions has used aluminium chloride ($AlCl_3$) as the source material for the aluminium ions, and this has been successful in producing a high beam current; furthermore the life of the source has been found to be as much as between 50 and 70 hours before the source requires replacement or replenishment. However, it has also been found that use of aluminium chloride does result in extended periods, beyond what is acceptable, for both tuning the ion source initially and subsequently servicing the ion source. Tuning times have been found to be typically more than one hour, while downtime due to the need to carry out servicing of the ion source (due to the hygroscopic nature of aluminium chloride) has been of the order of four hours. Such 'downtimes' are costly in terms of loss of production time and are perceived as unacceptable. The presence of water due to the fact that aluminium chloride is hygroscopic also significantly loads the vacuum system of an implanter.

Another method of producing aluminium ions has involved the use of solid aluminium oxide with silicon tetrafluoride being used as a reactant gas. In carrying out this method, silicon tetrafluoride is passed over heated aluminium oxide and a plasma is created in an ionization chamber to dissociate and ionize the products of the reaction, and, in so doing, produce the aluminium ions. While it has been found that the tuning time for such a procedure was acceptable (of the order of five minutes), it has also been found that the source life was less than adequate (i.e. less than twenty hours), and that there was significant flaking exhibited on the walls of the ionization chamber and significant erosion of the filament cathode, typically formed of tungsten.

More importantly, it has also been found by experiment that silicon ions formed during the ionization process contaminate the beam due to the presence of ions of $Si_{14}^{28}$ which gives a charge/mass ratio and mass which is close to that of the aluminium ions. This can lead to incorrect dosage of $Al^{1327}$ ions being measured due to the similarity of the charge/mass ratio of the aluminium and silicon ions; the $Si_{14}^{28}$ ions are, in some situations, not effectively filtered by the mass analyzer/selector of the ion implantation apparatus and the presence of the silicon ions therefore contributes to the overall measured current delivered to the substrate, thus, while contributing to the delivered ion current, providing a false reading of the aluminium ions actually delivered to the substrate. Once implanted into the silicon substrate, silicon ions are no longer detectable but disrupt the proper distribution of implanted Al ions. The mass resolution capability of the ion implanter can be increased to reduce this effect. However, increase in mass resolution reduces the useful current of aluminium ions to a level rendering the useable ion beam insufficient for volume production of substrates.

Thus, known processes for implanting aluminium ions into semiconductor substrates suffer from a number of drawbacks.

In consequence, it is perceived that there is a need to provide an improved source of and method of supply of aluminium ions. Additionally, it is desirable to achieve this with increased source life and reduced servicing requirement and particularly service downtime.

Interaction of nitrogen trifluoride ($NF_3$) with solid aluminium oxide ($Al_2O_3$) and solid aluminium nitride (AlN) under specific controlled conditions has been found and reported to produce a significantly increased yield of aluminium ions coupled with reduced start-up or tuning times, less contamination, and longer running times between shorter service intervals than has been exhibited in the prior art.

Nitrogen trifluoride has been used in a number of applications in the manufacture of semiconductors.

One use of nitrogen trifluoride has been previously suggested in U.S. Pat. No. 5,700,580 for the purpose of forming a nitride spacer over an underlying oxide layer and etching the nitride layer using an atmosphere of ionized fluorocarbon followed by a further step in which an atmosphere of $NF_3$ is combined with an ionized halogen containing compound.

The use of nitrogen trifluoride has also been suggested in ion implantation technology.

In U.S. Pat. No. 5,073,507, a process of producing beryllium ions and beryllium fluoride ions is disclosed in which boron trifluoride and beryllium are ionized in an ionization chamber to produce the required ions. In this disclosure, nitrogen trifluoride is suggested inter alia as an alternative to boron trifluoride.

In U.S. Pat. No. 5,707,424, there is disclosed an adsorption/desorption system for storing gases in which there is disclosed a range of storage media, which may include inter alia alumina, which may be supplied in porous form for storing a range of gases, including inter alia nitrogen trifluoride.

Nitrogen trifluoride has also been proposed as a medium for cleaning plasma chambers. In U.S. Pat. No. 5,620,526, there is disclosed a process for cleaning of a plasma chamber in which nitrogen trifluoride plasma is firstly passed at a first pressure through a plasma chamber to scour any oxide material that has been previously deposited on walls of the chamber and a second treatment plasma medium is then passed at a lower pressure through the chamber to further scour the walls. In the second stage, nitrogen trifluoride plasma is inter alia one of the gases that may be used. A final, third, stage of cleaning the chamber is undertaken using nitrogen trifluoride plasma.

In European Patent Application EP 0945892 A2, there is disclosed a method for in-process cleaning of an ion source during its operation, using a cleaning gas (such as nitrogen trifluoride) with a source of ionisable dopant gas such as phosphine ($PH_3$) and arsine ($ASH_3$). The cleaning gas dissociates to scour the plasma chamber of any phosphorus or arsenic deposited on the chamber walls and to reduce the likelihood of such deposits being formed. The nitrogen trifluoride dissociates into its respective ions to combine with the phosphorus or arsenic ions and the positive ions are then accelerated toward a mass analyzer magnet of the implantation system whereat ions having an inappropriate charge-to-mass ratio are blocked from proceeding further.

Use of nitrogen trifluoride as a reactive or etchant gas has also been suggested in U.S. Pat. No. 6,001,172 wherein a process and system are disclosed for producing dopant ions from reacting a metal element, such as indium, with inter alia nitrogen fluoride. It is suggested that the metal may be provided in the form of a molten rod, an ingot or boule, or as a wire mesh or sponge which is porous.

Thus, it can be appreciated that nitrogen trifluoride has been proposed for use in a number of different ways in various applications.

French Patent Application No. 2803090 (Chakor) proposes use of nitrogen trifluoride ($NF_3$) as the preferred gas for the ionization of alumina to produce aluminium ions. It also proposes use of a solid element of alumina, in the form of a lozenge of alumina as the source of aluminium ions, placed within the ionization chamber.

We have found that use of ($NF_3$) as the ionizing gas in producing aluminium ions produces unwanted and undesirable contamination in the ionization chamber environment, having carried out experiments with these source materials in a typical ionization chamber made from tungsten material. We discovered that use of these materials produced cyanide $(CN)^+$ ions and $(HCN)^+$ ions in quantities sufficient to contaminate the aluminium ion beam. It is believed that the contamination arises from the presence of carbon as the major constituent of the arc chamber which is used to form the ionization chamber. When the nitrogen fluoride ionizes within the ionization chamber, the nitrogen ions have a natural affinity for any residual carbon within the chamber.

CN ions are undesirable because the charge mass ratio of the CN ions $(CN)_{13}{}^{26}$ and its mass are sufficiently close to that of aluminium ions $Al_{13}{}^{07}$ as to produce contamination of the beam, in the same way as silicon $Si_{14}{}^{28}$ ions, as discussed above.

We have also observed that, when using $NF_3$ to produce aluminium, very small quantities of HCN are produced, though these are not problematic under controlled conditions and can be pumped away from the implantation apparatus along with other unwanted ions and subsequently scrubbed and disposed of. This HCN can also become ionized and directly contaminate the $Al^+$ ion as it has exactly the same mass.

The above description addresses the drawbacks of the production of aluminium ions by the specific use of nitrogen trifluoride. From this discovery, the present inventors and the applicants sought other solutions to the creation of aluminium ions and from their work discovered notwithstanding the results achieved when using $Al_2O_3$ and $NF_3$, that the present invention as disclosed herein, and defined by the claims, was more widely applicable to the more efficient generation of ions, including aluminium, erbium, magnesium, indium, cobalt, tungsten, platinum, rhenium, nickel, niobium, tantalum, molybdenum, zirconium and titanium. It also prompted the inventors to seek alternative methods of producing aluminium ions that were not capable of producing contaminants.

In one broad aspect, the present invention provides an ion implantation apparatus including an ionization chamber having a gas inlet port and an outlet through which ions created in the chamber can exit the chamber, the chamber containing an ion source body comprising aluminium oxide, a source of etchant gas selected from the group consisting of fluorine and sulphur hexafluoride under pressure connected to the inlet port of the chamber, and an energy source to ionize etchant gas in the chamber and thereby to form a plasma containing ions of aluminium derived from said ion source body.

The present invention further provides an ion implantation apparatus including an ionization chamber having a gas inlet port and an outlet through which ions created in the chamber can exit the chamber, the chamber containing an ion source body comprising a material selected from the group consisting of aluminium, aluminium nitride, magnesium, magnesium oxide, magnesium nitride, indium, indium oxide, indium nitride, and refractory metals, and oxides and nitrides thereof, capable of providing ions intended for implantation, a source of etchant gas selected from the group consisting of nitrogen trifluoride, boron trifluoride, fluorine and sulphur hexafluoride under pressure connected to the inlet port of the chamber, and an energy source to ionize etchant gas in the chamber and thereby to form a plasma containing ions of aluminium derived from said ion source body.

As stated above, it is foreseen that the present invention can be used for implantation of elemental ions, not only of aluminium but also of, for example, indium, erbium, cobalt, tungsten, magnesium, platinum, iridium, rhenium, nickel, niobium, tantalum, molybdenum, zirconium and titanium, provided that such elements are present in the ionization chamber in solid form, either in the form of the elements themselves, or, if appropriate, in the form of oxides and/or nitrides, and can preferably be provided in plate-like form within a chamber formed of a material which will not contaminate the ion generation. Metals such as aluminium, erbium, indium and magnesium are most suitably usable in the form of their oxides or nitrides. Although the invention is hereinafter described with reference specifically to the use of alumina or aluminium nitride, it is to be clearly and unambiguously understood that the invention is not limited simply to the generation of aluminium ions alone, but can be used for the generation of ions of other elements.

As discussed below, the energy source for generating an arc may comprise first and second electrodes providing a cathode and counter cathode. Alternatively, a microwave energy source may be used to cause dissociation and ionization of the etchant gas, e.g. nitrogen trifluoride and the source material. As a further alternative, any other suitable conventional means of effecting such dissociation and ionization of the nitrogen trifluoride (or other etchant gas) and the source material may also be used.

We found that using nitrogen trifluoride ($NF_3$) reactant gas with aluminium oxide ($Al_2O_3$) and aluminium nitride (AlN), we have achieved significantly improved results, as compared with use of aluminium trichloride, both in terms of aluminium ion yield, filament life expectancy, operational periods and service downtime. However, as previously stated, $NF_3$, when used with $Al_2O_3$, produces CN ions and HCN ions which have a similar mass/charge ratio and mass to Al ions, and to an extent that it produces significant contamination of the ion beam. We have found that fluorine and sulphur hexafluoride and boron trifluoride are useful alternatives to nitrogen trifluoride, provided that boron trifluoride is also not used with aluminium oxide, for the reasons discussed above. As compared with using nitrogen trifluoride, we have found that improved yields of ions have been obtainable using fluorine and sulphur hexafluoride, with aluminium oxide. Whereas use of nitrogen trifluoride produced an ion beam yield of about 2.28 mA, use of sulphur hexafluoride and fluorine produced a yield of 2.76 mA and use of fluorine yielded 3.00 mA, an increase in beam current of about 21% and 31% respectively over the prior art.

Where used hereinafter, the terms "pure alumina" and "pure aluminium nitride" mean alumina or aluminium nitride which has no or negligible iron content such as would contaminate, with any significance, the beam of aluminium ions to be implanted. From experiment and analysis, we have found that alumina or aluminium nitride having a purity where the iron content is less than 6 ppm is required. Less pure alumina or aluminium nitride may contain sufficient iron that when an ion beam is formed, the iron ions may contaminate the substrate due to the presence of doubly-charged ions of the iron isotope $Fe_{26}^{54}$, which has the same charge/mass ratio as $Al_{13}^{27}$.

It has been postulated that alumina in particular, used in particulate (i.e. powder or granular) form may absorb contaminants during reduction of the alumina to that form, from machine tools (e.g. of steel) which comprise iron. In addition, it has also been postulated that where alumina is to be preformed into various shapes for use in an ionization chamber, including blocks, plates, cylinders or the like, and then perhaps machined, it could or may become contaminated from contact with any mould or machine tool which is used to form the shape, such moulds or machine tools being typically formed from high grade steel and therefore comprising iron. As stated above, it has been believed that iron, in its doubly charged state, might have been a significant source of contaminant because the charge/mass ratio of its ion is substantially the same as that of an aluminium ion. However, where it is possible to produce alumina and aluminium nitride with a high enough degree of purity (i.e. less than 6 ppm Fe), then such powder or granular form may be used in an apparatus according to the present invention and in carrying out a method according to the present invention.

To a lesser extent, but no less significantly, it is also important to ensure, as can be inferred from above, that, where aluminium ions are being produced, boron (II) oxide (BO) is eliminated from the beam as, in ionized form, it too has a similar charge/mass ratio $BO_{13}^{27}$ equal to that of aluminium ions $Al_{13}^{27}$. Thus, alumina and aluminium nitride used in any suitable form as a source of aluminium ions should also be boron free. It is therefore essential that, when using, say, an ionization chamber to produce aluminium ions, the ionization chamber should be thoroughly purged clean beforehand to remove the possibility of such boron contamination. Thus, also, in using an apparatus according to the present invention, and in carrying out a method according to the present invention, boron trifluoride should not be used with the oxide of aluminium, and it should be clearly understood that the present invention excludes such combination.

Similar considerations apply where ions of other elements than aluminium are being generated, namely that the source of such ions should be free of contaminant having charge/mass ratio which is close enough to that of the desired ion as to be indistinguishable by the mass analyzer of an ion implanter.

An ionization chamber suitable for use in an apparatus according to the present invention may advantageously be of substantially cuboid form, in which event it has opposed end walls, opposed side walls, a top and a base, at least one end wall having a cathode mounted thereon and the opposite end wall having a counter cathode provided thereby or mounted therein, the ion source further comprising an electrical connector for connecting a power source to the electrodes for establishing an arc across the interior of the chamber. Where used herein, the terms "top", "base", "end walls" and "side walls" are used only to describe and indicate the relative dispositions of these parts of a chamber to one another and are not to be understood as indicating the positions which they necessarily occupy when the chamber is mounted for use in an ion implanter. However, for the purposes of explanation, it can be assumed that the inlet port, through which etchant gas is introduced into the chamber, is provided in the 'base' and that the outlet, through which ions can exit the chamber, is provided by the 'top' of the chamber.

The arrangement of the cathode and counter cathode ensures that electrons produced at the cathode are entrained between the two electrodes. A magnetic field produced by an external source and extending parallel to the line between the two electrodes ensures that the electrons are maintained in spiral orbit between the electrodes.

In preferred embodiments of the present invention, the ion source material is preferably in the form of an integral rigid body through or across which etchant gas can pass. We have found with one preferred embodiment, specifically intended for the generation of aluminium ions, that improved aluminium ion beam production has been achievable by providing the solid material in the form of a single integral rigid body which is porous. Thus, for example, the solid material may be provided in the form of a lining panel or plate, porous or fully dense, for the base of the ionization chamber. We have found that excellent results can be obtained when the solid material is provided in the form of a flat plate which can be placed on the base of an ionization chamber, at least partially overlying a gas inlet port to the interior thereof such that the source gas (e.g. fluorine or sulphur hexafluoride) must permeate through the material, and react with it when the chamber is heated and an arc established in the chamber to produce the required ions, e.g. aluminium ions (including $Al^+$, $Al^{++}$, $Al^{+++}$).

We have observed that a solid plate, when subjected to the conditions within an ionization chamber, may be subject to cracking or splitting, due to the thermal stresses imposed upon it, both along the length of the plate and transverse thereto. From this observation, we have also noted that such cracking or splitting of such a plate did not produce adverse performance, but, on the contrary, improved it. From this, it was deduced that improved performance was due to increased surface area and possible reduction in size of fragments of the original plate when these had broken off. Where fragments broke away from the plate, these fragments were then no longer subject to thermal stresses imposed through the length of the plate. This also applies to source material for ions of other elements.

From these observations, we have deduced that preferred forms of ion source material (e.g. alumina or magnesium) are provided by an element in the form of a single plate, or a multi-part plate, suitable for use in an ion implantation apparatus according to the present invention, which, when its external dimensions are compared with an uncontoured solid plate of the same dimensions, has increased surface area in comparison therewith and/or is formed by a plurality (i.e. two or three) of smaller plates which, when assembled together, have the same overall external dimensions as a larger single plate. This also applies to source material for ions of other elements.

To this end we have formed single plates having a plurality of grooves formed therein, the grooves extending lengthwise of the longest dimension of the plate and/or transversely thereto. We have also formed such plates with spaced apertures and/or recesses therein, such apertures and/or recesses being arranged in longitudinal and transverse rows over the entire surface of the plate. Limited cracking was seen to occur in grooved plates and none at all in plates which were formed with spaced apertures or recesses therein. It is considered that the provision of apertures and/or recesses relieved such stresses as would occur in a unitary non-apertured plate and prevented or reduced the likelihood of any cracking or splitting. Experiments with sets of smaller plates used in abutting relationship under the same conditions, with and without any grooving, recessing or forming of apertures therein, also demonstrated no cracking or splitting even after extended use.

We have also found, by experiment, that optimum results are achieved by positioning such a liner plate on the base of the chamber, as compared with against the side or end walls or against the top of the chamber. Furthermore, we have found that adverse results are achieved if too much of the interior surfaces of the chamber are lined with the source material. The reason for adverse results is observed to be that where, for example, the chamber is formed of tungsten and the cathode is also formed of tungsten, provision of liners on too large a proportion of the interior of the chamber causes the cathode to become coated with the source material and eventually to cease to function efficiently. From our experiments, we have deduced that to cover more than about 40% of the interior of the chamber contributes significantly to this problem. We have also deduced that completely acceptable results are achieved, in terms of ion beam enhancement and cathode life by providing a liner on the base of the chamber only, and then closer to the counter cathode than the cathode with the liner not screening the entire base. We have achieved very acceptable results where the liner covers between 20% and 50% of the internal area of the base of the chamber.

As previously mentioned also, we have observed cracking of liner plates within the chamber, especially when such plates are placed close to the cathode or against the end wall through which the cathode extends into the chamber, and, whilst cracking to some extent appears to enhance the results achieved, unless it can be controlled, it can lead to non-uniform results in the rate of creation of ions.

A preferred element according to the present invention for use in an ionization chamber in the generation of ions (for example of aluminium) may be formed by a method which comprises filling a mould having the desired contours of the element with ion source material, in powder form and then sintering the material at an appropriate temperature of, in the case of aluminium oxide or nitride, about 1100° C., to form porous alumina or aluminium nitride, to about 1500° C., to form the fully dense form, to thus form a unitary body thereof. Alternatively, such a body may be formed by compressing the powder at a substantially lower temperature at a pressure such that the powder is compressed into a unitary self-sustaining body.

Suitable materials from which to create the mould are tool grade steel ("tool steel") and high temperature refractory ceramic materials, where insignificant contaminant will be present. Similarly, if it is more desirable to machine channels, grooves, apertures and/or recesses rather than to form them at the time of moulding the element (e.g. plate), then machine tools for so working the moulded element must also be free of such contaminants. Suitable tool steels are widely available for such purpose.

As an alternative to provision of the source material in plate form, it is also possible to provide it in the form of a coiled roll or cylinder positioned within the chamber, provided that an arc can be struck and a plasma sustained between the electrodes. As a further alternative form, the source material may comprise sheet form mesh material.

The present invention further provides a method of generating aluminium ions for implantation into a substrate mounted in an ion implantation apparatus, the method comprising placing a preformed body of solid alumina as ion source material in an ionization chamber, supplying a gas selected from the group consisting of fluorine and sulphur hexafluoride to the chamber to contact the ion source material, generating a plasma in the ionization chamber to cause dissociation and ionization of the ion source material and the gas, and extracting the resultant aluminium ions from the ionization chamber for implantation.

The present invention further provides a method of generating ions for implantation into a substrate mounted in an ion implantation apparatus, the method comprising placing a preformed body of solid ion source material, selected from the group consisting of aluminium nitride, magnesium, indium and oxides and nitrides thereof, and refractory metals and oxides and nitrides thereof, all capable of providing ions intended for implantation, in an ionization chamber, the ion source material being in the form of a preformed solid which at least partially lines the interior of the chamber, supplying a gas selected from the group consisting of nitrogen trifluoride, boron trifluoride, fluorine and sulphur hexafluoride to the chamber to contact the solid ion source material, generating a plasma in the ionization chamber to cause dissociation and ionization of the source material and the gas, and extracting the resultant ions from the ionization chamber for implantation, the ion source material and the etchant gas being selected such that no additional ions are created having the same or similar charge/mass ratio to that of the selected ions.

The reaction of the source gas with the oxide or nitride generates a vapour pressure sufficient to support a plasma, in addition to the pressure of the gas supply. If desired, the chamber may itself be heated.

The present invention further provides an ion implantation apparatus including an ion source comprising a chamber having a gas inlet port and an outlet, the chamber containing an aluminium ion source body in the form of at least one plate having planar surfaces and a thickness, the plate being porous and formed from pure alumina, a source of an etchant gas selected from the group consisting of fluorine and sulphur hexafluoride under pressure connected to the inlet port of the chamber; an energy source to ionize etchant gas in the chamber and thereby to form a plasma containing ions of aluminium derived from said ion source body; and at least one ion extraction electrode associated with the ion source for extracting the aluminium ions from the chamber through said outlet, said ion source body being located within the chamber and in opposed relationship to said at least one ion extraction electrode.

The present invention still further provides an ion implantation apparatus including an ion source comprising a chamber having a gas inlet port and an outlet, the chamber containing an ion source body in the form of at least one plate having planar surfaces and a thickness, the plate being porous and formed from a material selected from the group consisting of aluminium nitride, magnesium, indium, and oxides and nitrides thereof, and pure refractory metals, a source of etchant gas, selected from the group consisting of nitrogen trifluoride, boron trifluoride, fluorine and sulphur hexafluoride under pressure, connected to the inlet port of the chamber, an energy source to ionize etchant gas in the chamber and thereby to form a plasma containing ions derived from said ion source body; and at least one ion extraction electrode associated with the ion source for extracting the ions from the chamber through said outlet, said ion source body being located within the chamber adjacent said counter cathode and in opposed relationship to said at least one extraction electrode.

There now follows a detailed description, which is to be read with reference to the accompanying drawings, of an ion implantation apparatus according to the present invention; it is to be clearly understood that this apparatus has been selected for description to illustrate the invention by way of example only.

Figure 1:
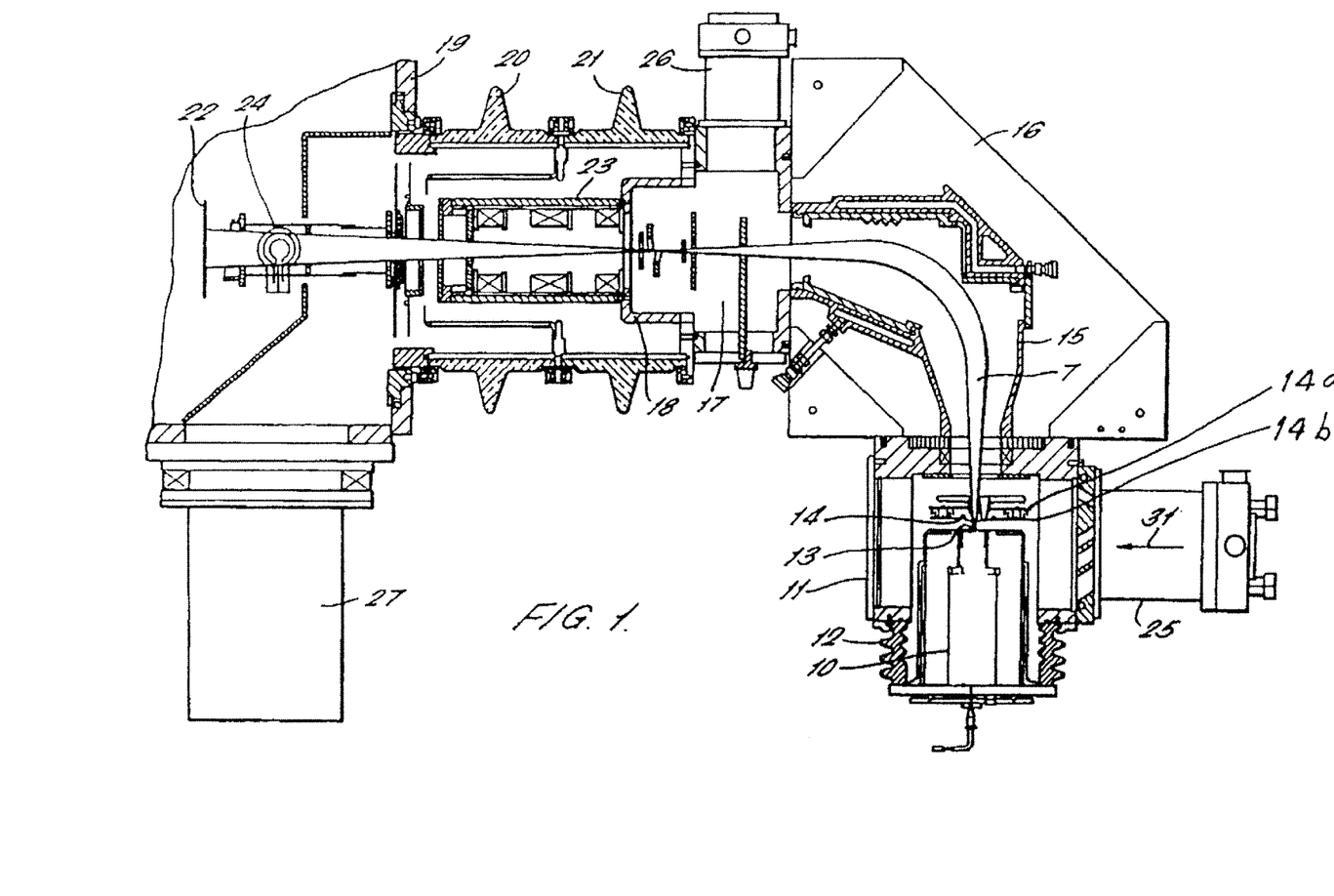
FIG. 1 is a schematic plan view of an ion implantation apparatus according to the present invention, incorporating an ion source according to the present invention.

Referring to FIG. 1, an implantation apparatus according to the present invention is illustrated schematically. In the apparatus, ions for implanting are generated in an ion source indicated generally at 10. The ion source illustrated is a Bernas ion source which will be described in more detail below with reference to FIG. 2. The ion source is mounted on a housing 11 by means of an insulating bushing 12, so that the ion source can be biased relative to the housing to generate the required extraction potential to extract ions from the source and accelerate them to the required transport energy of the ion beam. Ions are extracted from the source through a slit 13 therein and accelerated to the required transport energy by the potential difference between the slit and one or more extraction electrodes illustrated generally at 14.

The extraction electrodes illustrated generally at 14 in FIG. 1 are provided externally of the ionization chamber 10. Similar electrode arrangements are disclosed in our U.S. Pat. Nos. 5,883,391, 5,920,076 and 5,977,552 which are hereby incorporated herein by reference.

In U.S. Pat. No. 5,920,076, there is disclosed a known extraction electrode structure which is typical of a structure that can be used with an ion source of an ion implantation apparatus according to the present invention. In that structure, a pair of electrodes is spaced from the ion source, as represented at 14a, 14b in FIG. 1 of the accompanying drawings. The electrodes are also spaced and insulated from each other. Opposed apertures are formed in the electrodes in line with the slit 13 in the chamber of the ion source.

In generating an ion beam, the ion source is voltage biased relative to the extraction electrodes, and ions are extracted from the ion source, accelerate towards the electrodes and pass through the apertures therein. The extraction electrode 14a furthest from the ion source is maintained at ground potential while the ion source and the electrode 14b closest to the ion source are progressively more positively biased relative to the electrode 14a. The electrode 14b serves to prevent electrons which are present in the space forward of the extraction electrode pair and are required to neutralize the ion beam, from sweeping back to the ion source.

The ion beam emanating from the ion source under the influence of the extraction electrode structure is tuned to the required energy and beam current by adjusting the voltage of the electrode 14b and the ion source and/or adjusting the size of the gap between the ion source and the electrode structure. The position of the electrodes relative to the ion source can also be adjusted to match the electrodes optically to the ion source.

Each of the above-mentioned U.S. patents provides improvements and modifications to this exemplary arrangement and such improvements and modifications are hereby incorporated herein by reference.

Ions extracted from the ion source through the extraction electrodes 14a, 14b then pass from the ion source housing 11 into the flight tube 15 of an analyzing magnet 16. In the analyzing magnet 16, the ions in the beam 7 from the source travel through a region of strong magnetic field causing the ions to adopt flight paths having radii of curvature dependent on the mass/charge ratio of the individual ions.

Ions of a predetermined range of mass/charge ratios travel through the analyzing magnet in curves to emerge substantially at right-angles to the original beam path, into a mass selecting region 17 containing one or more slits to define precisely the mass/charge ratio selected by the apparatus for implanting.

In the form of ion implantation apparatus illustrated, the ions may be extracted from the ion source 10 and accelerated to energies of about 10 keV-60 keV, and preferably 40 keV to 50 keV. The ions are retained at this energy throughout their passage through the analyzing magnet and the mass selection region 17. For this purpose, the flight tube 15 of the analyzing magnet, the housing 18 of the mass selection region and the housing 11 are maintained at uniform potential. The Bernas ion source 10 is biased at the extraction potential, e.g. 40 keV or 50 keV relative to this flight tube ground potential, to generate the required extraction bias.

In a practical implanter, implantation energies of up to 200 keV or more may be required, so that it is necessary to accelerate the ions (still at a maximum 60 keV) leaving the mass selection region 17 to the higher required implantation energy. For this purpose, housing 19, containing the semiconductor wafer to be implanted is insulated from the housing 18 by means of insulating bushings 20 and 21. Wafer 22 to be implanted is mounted on a holder in the housing 19, and the whole target region including housing 19 and wafer holder is held at ground potential. The housing 18 is then biased as required relative to the target housing 19 to provide the required post acceleration potential to accelerate the mass selected ions to the required implantation energy.

Immediately before the accelerated beam impinges upon the wafer 22, a plasma gun 24 floods the beam and the wafer with low energy electrons to neutralize any charge accumulation on the surface of the wafer due to implanted ions.

It will be appreciated that the entire beam line is maintained at very low pressure. Turbo pumps 25 and 26 are provided to evacuate the ion source and the mass selection region respectively. A further cryogenic pump 27 maintains the pressure in the target region as low as possible to minimize contamination. Although the described apparatus is capable of further accelerating the ions after mass selection by as much as 160 keV for implantation (or 190 keV for high energy implantation), the apparatus can also operate with lower implantation energies. Indeed, by biasing the target region in the opposite direction, the mass selected beam can be decelerated to below the ion source extraction energy.

The processing speed for wafers exposed to the beam of ions for implantation is dependent amongst other things on the beam current density of required ions impinging upon the wafer. Especially for low implantation energy applications, there are difficulties in maintaining the beam current of ions being implanted at satisfactory levels.

Figure 2:
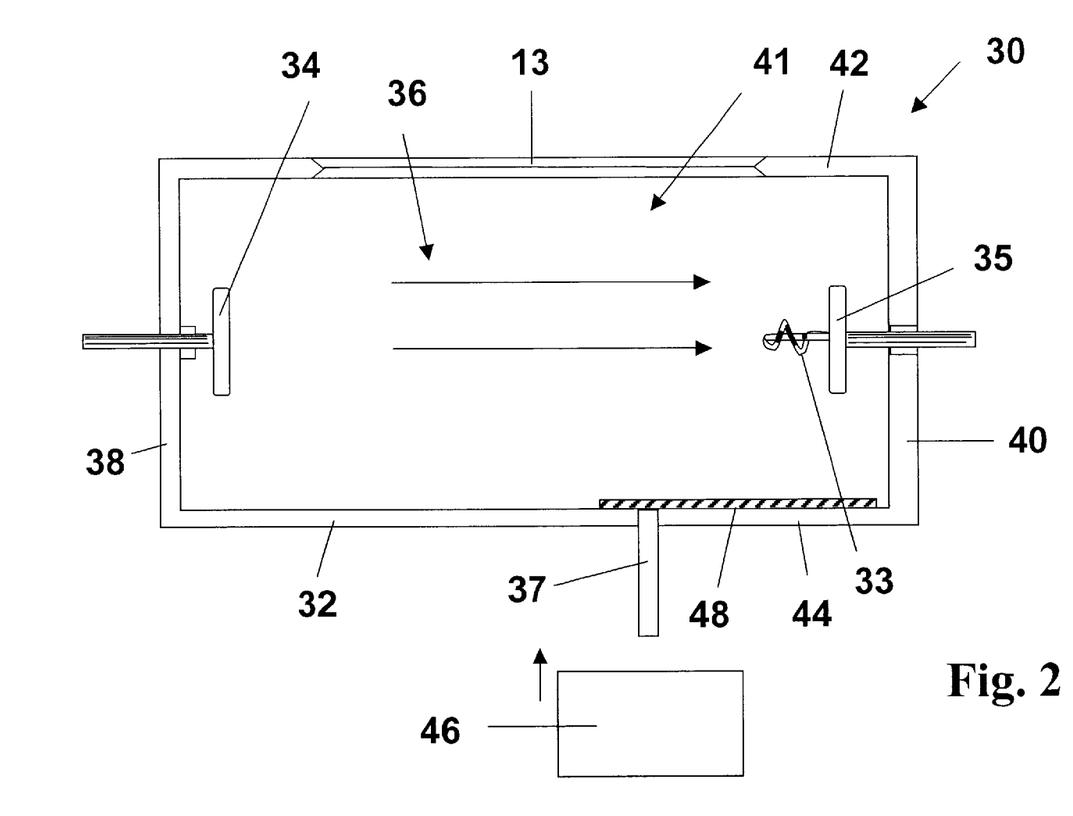
FIG. 2 is a schematic side elevation, partially in section, of an ionization chamber providing an ion source according to the present invention for use in an ion implantation apparatus according to the present invention.

Referring to FIG. 2, there is shown a modified form of ion source for use with the apparatus of FIG. 1 which can increase the proportion of the desired ions in the beam current extracted from the source, so that the residual beam current of the desired ions implanted in the wafer can also be increased. The associated extraction electrodes are omitted for clarity.

Referring to FIG. 2, this illustrates in cross-section a Bernas ion source 30, seen from one side in the drawing of FIG. 1 in the direction of arrow 31. The ion source 30 comprises an ionization chamber 32 which, as can be seen from FIG. 2, is defined by a housing which is substantially cuboid in shape and comprises end walls 38, 40, side walls, only one of which 41 is shown, top 42 and base 44. The side walls, base and top of the ionization chamber are ideally formed of a material which will not be a source of contaminants in the ion beam. In the embodiment shown in FIG. 2, a plate 48 of the desired ion source material is positioned on the inside surface of the base 32.

Where the source material, in the form of the plate 48, comprises alumina, the elected source gas will be fluorine or sulphur hexafluoride and not nitrogen trifluoride or boron trifluoride. For other ion source materials, however, both of these gases can be used.

A filament 33 extends through wall 40 at one end forming a cathode with a counter-cathode 34 extending through wall 38 at the other end of the ionization chamber. An additional reflector 35 is located between the filament 33 and the wall 40 of the chamber.

In operation, the filament 33 is heated by a current to emit thermal electrons and the cathode filament 33 together with both the countercathode 34 and the reflector 35 are biased at a substantial negative potential relative to the housing 32. The emitted electrons are accelerated by the bias field and constrained to travel in helical paths between the filament 33 and the countercathode 34 by a magnetic field 36 extending between the filament and the counter cathode.

A supply 46 of source gas, which as described above, may be nitrogen trifluoride, fluorine, sulphur hexafluoride or boron trifluoride (depending upon the ion source material used), is connected to the ionization chamber 32 via an inlet 37 and the gas is dissociated and/or ionized by the electrons, thereby forming a plasma of charged particles when the ionization chamber is operating. The plasma sustains a temperature of the order of 1000° C. and the heated ions react with the source material to produce, inter alia, the desired ions. The positively charged ions are extracted from the ionization chamber through a slit 13 by an extraction potential between the ionization chamber and an extraction electrode (not shown), as a beam 7 passing through the slit 13 (shown in FIG. 1) as described above for ultimate delivery to the semiconductor wafer 22.

In constructing the ionization chamber illustrated in FIG. 1, it is desirable to use only materials such as tungsten and graphite, which avoid the possibility of other contaminants in the beam line.

Referring now to FIGS. 3 to 12, there are illustrated several examples of plates which can be located in the ionization chamber 32 to provide a source of aluminium ions. Each such plate is formed of pure alumina or pure aluminium nitride. As previously stated, the source material should be as pure as possible and contain no or negligible quantities of contaminants, such as iron or boron, such as would give rise to ions having the same or indistinguishable charge/mass ratio when compared with aluminium ions, and thereby provide an incorrect measurement of the aluminium ion current.

Figure 3:
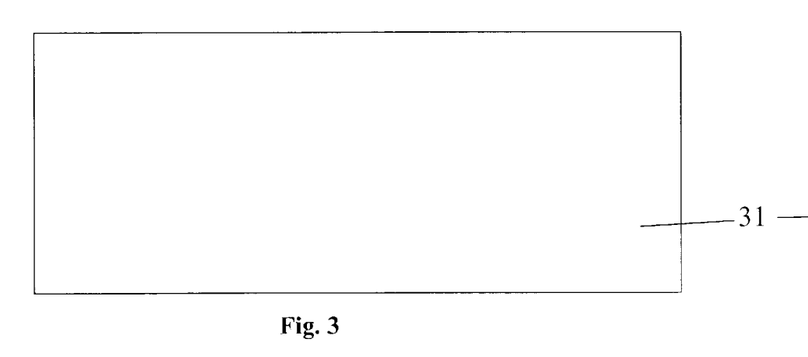
FIGS. 3 and 4 are plan and end views respectively of a first element according to the present invention for use in an ionization chamber as shown in FIG. 2.
Figure 4:
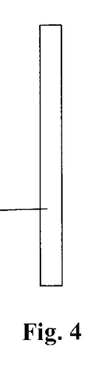

The embodiment illustrated in FIGS. 3 and 4 is a flat rectangular plate 31 of 4 cm×10 cm dimensions and of approximately 3 mm thickness, which may be porous or fully dense. This plate is placed on the base of the ionization chamber, as shown in FIG. 2. In use, such a plate, while satisfactorily delivering aluminium ions, has been found to crack, though cracking has not been found to adversely affect the ion beam produced.

Figure 5:
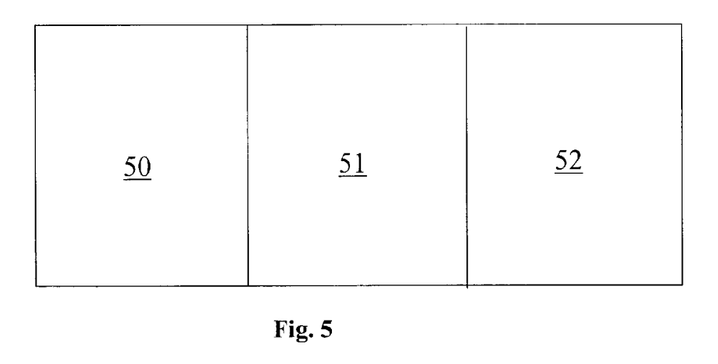
FIGS. 5 and 6 are plan and end views respectively of a second element according to the present invention for use in an ionization chamber as shown in FIG. 2.
Figure 6:
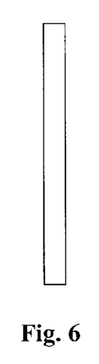

In FIGS. 5 and 6, there is illustrated a further embodiment which has the same overall dimensions as that shown in FIGS. 3 and 4 but which comprises three separate plates 50, 51, 52. The use of plates of smaller size compared with that shown in FIGS. 3 and 4 reduces cracking or splitting due to thermal stress. It may not always be appropriate or required to provide all three plates of the source material and in some circumstances, we have found that it is advantageous to provide, say, two of the three plates from the source material.

Figure 7:
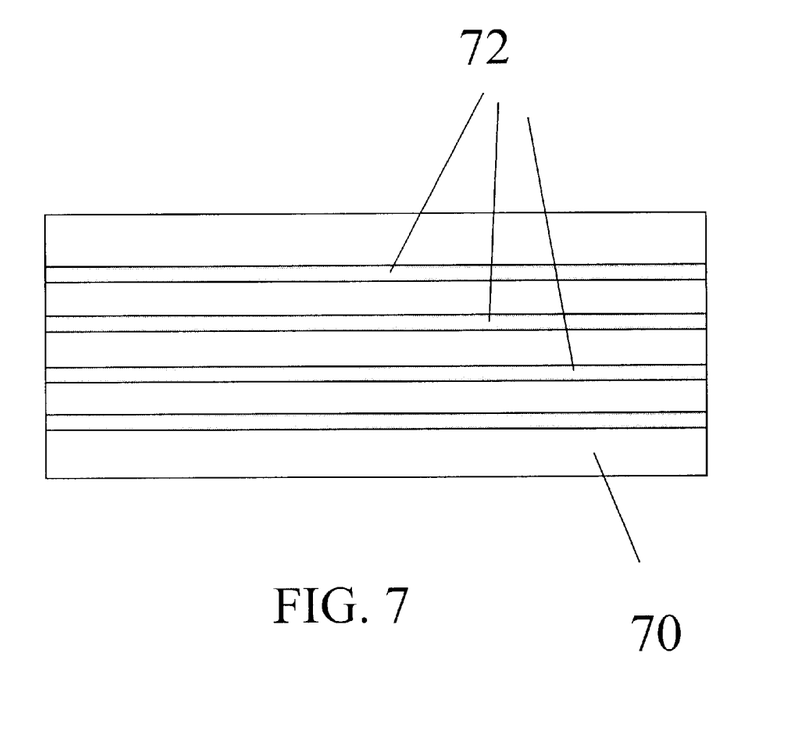
FIGS. 7 and 8 are plan and end views respectively of a third element according to the present invention for use in an ionization chamber as shown in FIG. 2.
Figure 8:
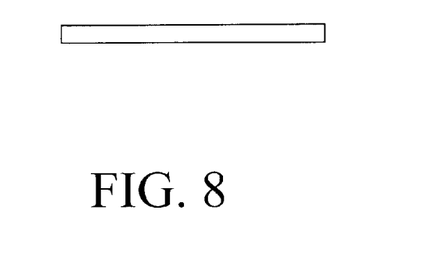

In FIGS. 7 and 8, there is illustrated another embodiment of a plate 70, having the same overall dimensions as the embodiment shown in FIGS. 3 and 4 but in which a plurality of spaced, parallel grooves or channels 72 is formed along the plate, parallel to its length. These grooves/channels 72 have been found to provide two advantages, namely that they increase the overall surface area of the plate itself and thus the surface area of the plate which is exposed to the selected source gas, and they relieve the thermal stress created in the plate when it is heated, thereby reducing the effect of cracking or splitting which has been noticed in plates of the type shown in FIGS. 3 and 4.

Figure 9:
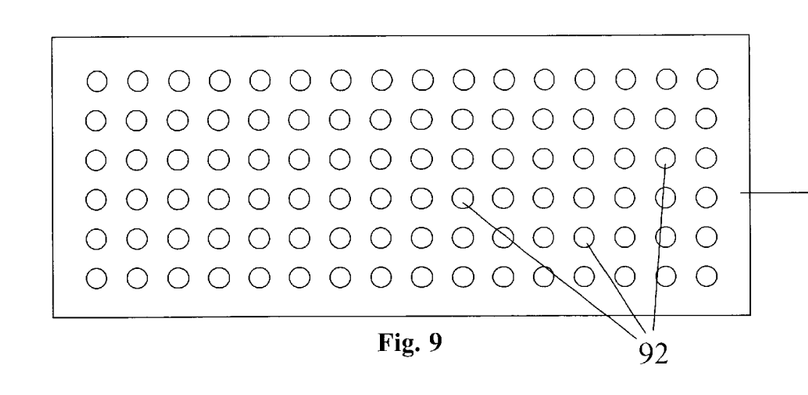
FIGS. 9 and 10 are plan and end views respectively of a fourth element according to the present invention for use in an ionization chamber as shown in FIG. 2.
Figure 10:
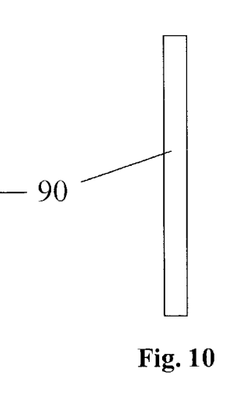

In FIGS. 9 and 10, there is shown a further single plate 90 of the same overall dimensions as for the embodiments in FIGS. 3, 4 and 7, 8. In this embodiment, a plurality of holes 92 is formed in the plate, the holes 92 being arranged in six rows, each comprising sixteen apertures which are also aligned in sixteen transverse rows. The holes 92 are 3 mm in diameter and are themselves spaced apart, both longitudinally and transversely, by separations of 3 mm. In experiment, no cracking or splitting of such a plate has been found. The combined surface area of the walls of the holes 92 increases the total surface area of the plate by approximately 60% compared with the surface area of a flat plate such as is shown in FIGS. 3 and 4.

Figure 11:
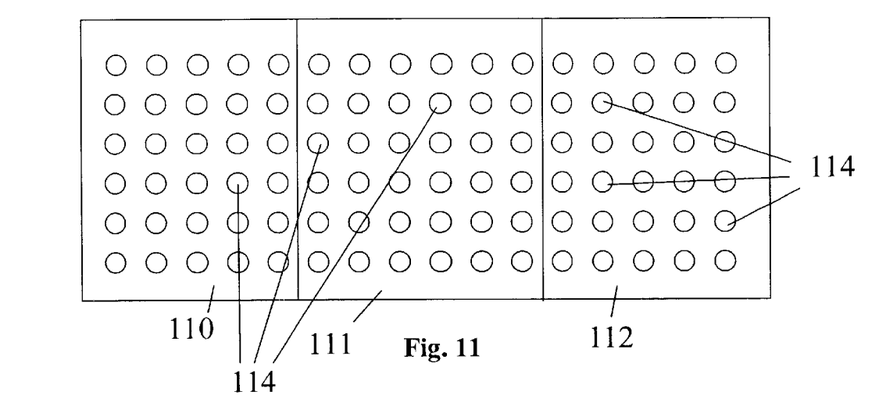
FIGS. 11 and 12 are plan and end views respectively of a fifth element according to the present invention for use in an ionization chamber as shown in FIG. 2.
Figure 12:
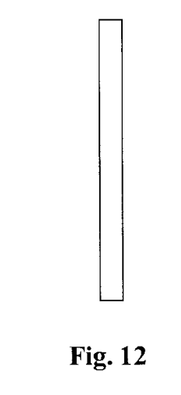

In FIGS. 11 and 12, there is shown a triple element plate 110, 111, 112 equivalent to the plate 50 shown in FIGS. 5 and 6 but having the same aperture arrangement as the embodiment of FIGS. 9 and 10. The two plates 110, 112 each have thirty apertures 114 provided therein, arranged in five transverse and six longitudinal rows, while the apertures in the central element are arranged in a 6×6 formation. It will be understood from the foregoing that it is contemplated that, if the chamber is of a shape other than that described, then the liner can be formed accordingly, to follow the contour of the chamber interior.

It will be appreciated that the embodiments described above, and particularly those described and illustrated herein with reference to the accompanying drawings are exemplary of the present invention and that other embodiments are envisaged within the scope of the claims.

What is claimed is:

1. An ion implantation apparatus including an ionization chamber having a gas inlet port and an outlet through which ions created in the chamber can exit the chamber, the chamber containing an ion source body comprising aluminium oxide, a source of etchant gas selected from the group consisting of fluorine and sulphur hexafluoride under pressure connected to the inlet port of the chamber, and an energy source to ionize etchant gas in the chamber and thereby to form a plasma containing ions of aluminium derived from said ion source body.

2. An ion implantation apparatus including an ionization chamber having a gas inlet port and an outlet through which ions created in the chamber can exit the chamber, the chamber containing an ion source body comprising a material selected from the group consisting of aluminium, aluminium nitride, magnesium, magnesium oxide, magnesium nitride, indium, indium oxide, indium nitride, and refractory metals, and compounds thereof, capable of providing ions intended for implantation, a source of etchant gas selected from the group consisting of nitrogen trifluoride, boron trifluoride, fluorine and sulphur hexafluoride under pressure connected to the inlet port of the chamber, and an energy source to ionize etchant gas in the chamber and thereby to form a plasma containing ions of aluminium derived from said ion source body.

3. An ion implantation apparatus according to claim 2 wherein the refractory metal is selected from the group consisting of erbium, cobalt, tungsten, platinum, iridium, rhenium, nickel, niobium, tantalum, molybdenum, zirconium and titanium.

4. An ion implantation apparatus according to claim 2 wherein the ionization chamber is of substantially symmetrical form having an axis of symmetry and opposed end walls, said energy source comprising first and second electrodes providing a cathode and counter cathode extending into the chamber, the energy source further comprising a connector for electrically connecting a power source to the first and second electrodes for establishing an arc across the interior of the chamber.

5. An ion implantation apparatus according to claim 4 wherein the ionization chamber is of substantially cuboid form and has opposed side walls, end walls, a top and a base.

6. An ion implantation apparatus according to claim 5 wherein said cathode is mounted in one of said opposed end walls.

7. An ion implantation apparatus according to claim 6 wherein said counter cathode is mounted in the other of said opposed end walls.

8. Ion implantation apparatus according to claim 1, wherein the ion source body is in rigid preshaped form, lining at least a part of an interior wall of the chamber.

9. Ion implantation apparatus according to claim 2, wherein the ion source body is in rigid preshaped form, lining at least a part of an interior wall of the chamber.

10. Ion implantation apparatus according to claim 8, wherein the gas inlet port is provided in a wall of the chamber and said ion source body is positioned against said wall so that the gas flows in contact with the ion source body, in entering the chamber.

11. Ion implantation apparatus according to claim 9, wherein the ion source body is in the form of a plate.

12. Ion implantation apparatus according to claim 11, wherein the plate is provided with a plurality of apertures extending through the plate.

13. Ion implantation apparatus according to claim 9 wherein the ion source body comprises sheet form mesh material.

14. An ion implantation apparatus according to claim 1 wherein the chamber is formed of carbon.

15. An ion implantation apparatus according to claim 1 wherein the chamber is formed of tungsten.

16. Ion implantation apparatus according claim 8 wherein the ion source body is porous.

17. Ion implantation apparatus according to claim 8 wherein the ionization chamber is of substantially symmetrical form having an axis of symmetry and opposed end walls, with the energy source comprising a cathode and counter cathode extending through the side walls for connection to a power supply therefor, the preshaped ion source body being located adjacent said counter cathode.

18. An ion implantation apparatus including an ion source comprising
   a chamber having a gas inlet port and an outlet, the chamber containing an aluminium ion source body in the form of at least one plate having planar surfaces and a thickness, the plate being porous and formed from pure alumina,
   a source of an etchant gas selected from the group consisting of fluorine and sulphur hexafluoride under pressure connected to the inlet port of the chamber,
   an energy source to ionize etchant gas in the chamber and thereby to form a plasma containing ions of aluminium derived from said ion source body; and
   at least one ion extraction electrode associated with the ion source for extracting the aluminium ions from the chamber through said outlet,
   said ion source body being located within the chamber and in opposed relationship to said at least one ion extraction electrode.

19. An ion implantation apparatus including an ion source comprising
   a chamber having a gas inlet port and an outlet, the chamber containing an ion source body in the form of at least one plate having planar surfaces and a thickness, the plate being porous and formed from a material selected from the group consisting of aluminium nitride, magnesium, indium, and oxides and nitrides thereof, and pure refractory metals,
   a source of etchant gas selected from the group consisting of nitrogen trifluoride, boron trifluoride, fluorine and sulphur hexafluoride under pressure connected to the inlet port of the chamber,
   an energy source to ionize etchant gas in the chamber and thereby to form a plasma containing ions derived from said ion source body, and
   at least one ion extraction electrode associated with the ion source for extracting the ions from the chamber through said outlet, said ion source body being located within the chamber, in opposed relationship to said at least one extraction electrode.

20. A method of generating aluminium ions for implantation into a substrate mounted in an ion implantation apparatus, the method comprising placing a preformed body of solid alumina as ion source material in an ionization chamber, supplying a gas selected from the group consisting of fluorine and sulphur hexafluoride to the chamber to contact the ion source material, generating a plasma in the ionization chamber to cause dissociation and ionization of the ion source material and the gas, and extracting the resultant aluminium ions from the ionization chamber for implantation.

21. A method of generating ions for implantation into a substrate mounted in an ion implantation apparatus, the method comprising placing a preformed body of solid ion source material, selected from the group consisting of aluminium nitride, magnesium, indium and oxides and nitrides thereof, and refractory metals and oxides and nitrides thereof, all capable of providing ions intended for implantation, in an ionization chamber, the ion source material being in the form of a preformed solid which at least partially lines the interior of the chamber, supplying a gas selected from the group consisting of nitrogen trifluoride, boron trifluoride, fluorine and sulphur hexafluoride to the chamber to contact the solid ion source material, generating a plasma in the ionisation chamber to cause dissociation and ionisation of the source material and the gas, and extracting the resultant ions from the ionisation chamber for implantation, the ion source material and the etchant gas being selected such that no additional ions are created having the same or similar charge/mass ratio to that of the selected ions.

22. A method according to claim 21 wherein the refractory metals are selected from the group consisting of oxides and nitrides of erbium, cobalt, tungsten, platinum, iridium, rhenium, nickel, niobium, tantalum, molybdenum, zirconium and titanium.

23. A method according to claim 18 wherein the preformed solid ion source material is porous and the gas is introduced into the chamber through the porous source material.

* * * * *